United States Patent [19]

Pollmeier et al.

[11] Patent Number: 4,939,443

[45] Date of Patent: Jul. 3, 1990

[54] METHOD AND APPARATUS FOR THE GENERATION OF VOLTAGE PULSES

[75] Inventors: Werner Pollmeier, Verl; Manfred Götz, Brakel, both of Fed. Rep. of Germany

[73] Assignee: Nixdorf Computer AG, Paderborn, Fed. Rep. of Germany

[21] Appl. No.: 295,633

[22] Filed: Jan. 10, 1989

[30] Foreign Application Priority Data

Jan. 11, 1988 [DE] Fed. Rep. of Germany ....... 3800511

[51] Int. Cl.⁵ .............................................. G05F 1/565
[52] U.S. Cl. ........................................ 323/284; 323/288
[58] Field of Search .............. 323/242, 244, 274, 280, 323/284, 288, 326, 283

[56] References Cited

U.S. PATENT DOCUMENTS

| | | | |
|---|---|---|---|
| 3,579,090 | 5/1971 | Madsen | 323/284 |
| 4,146,830 | 3/1979 | Foster | 323/244 |
| 4,186,336 | 1/1980 | Weinberg et al. | 323/284 |
| 4,414,501 | 11/1983 | Bedard et al. | 323/280 |
| 4,634,956 | 1/1987 | Davis et al. | 323/288 |

Primary Examiner—Peter S. Wong
Attorney, Agent, or Firm—Dykema Gossett

[57] ABSTRACT

The present invention relates to a method and apparatus for the generation of voltage pulses for controlling the switching operation in switching power supplies. A voltage increase of a pulse generator is respectively started when reaching a first, lower threshold (A). Resetting of the voltage increase is carried out in free-running mode, when the voltage increase reaches a second (D) or a third (C) threshold lying between the first (A) and the second (D) one. In sync mode, the pulse edges occurring in the synchronization signal ($V_{sync}$) effect resetting of the voltage increase. The advantages of the invention lie in the fact that the switching current, occurring at the change form free-running mode to sync mode due to the frequency difference, is minimized and that the generator operates reliably.

29 Claims, 4 Drawing Sheets

METHOD AND APPARATUS FOR THE GENERATION OF VOLTAGE PULSES

TECHNICAL FIELD

The present invention relates to a method and apparatus for the generation of voltage pulses for controlling the switching operation in switching power supplies, wherein a voltage increase, starting from a first, lower threshold, is reset to the initial value when a second, higher threshold is reached or a synchronization signal occurs.

BACKGROUND ART

It is known in the art to use a method for the generation of a sawtooth voltage by a pulse generator for triggering the primary-side switching transistor of stabilized switching power supplies in a control and regulating circuit. Thereupon, the sawtooth voltage is supplied to a pulse duration modulator which varies the duration of the conductive state of the switching transistor and consequently the energy output taken from the supply. In the secondary circuit of the switching power supply a voltage is induced which is rectified and smoothed and which represents the output voltage of the switching power supply. This voltage is compared with an internal reference voltage and, in the event of deviations relative to this reference value, is readjusted by the control and regulating circuit as a function of the duration of the conductive state of the switching transistor.

The sawtooth generator of the switching circuit comprises a current source as well as a transistor which is used for alternately charging and discharging a capacitor. Then voltage pulses in the form of sawteeth occur at the capacitor.

The use of switching power supplies for feeding devices equipped with visual display units requires the synchronization of the switching frequency with the line-deflecting frequency of the visual display unit. In the event of deviations between these two frequencies, due to interference of these two frequencies display interferences such as streaks may occur. Therefore, two modes of operation of the sawtooth pulse generator are used, which controls the generation of switching pulses. In a free-running mode, the generator oscillates at a preset rated frequency. The discharging of the capacitor and consequently the resetting of the voltage increase is triggered by a threshold circuit when exceeding a certain upper voltage value. For the other mode of operation, the sync mode, the frequency of the generator is determined by an external synchronization signal. The activation of the respective mode depends on the presence of the synchronization signal at the synchronization input of the generator. When the synchronization input is not triggered, the free-running mode is activated automatically. But when the synchronization signal of a defined voltage level is supplied to the generator, the sync mode is activated.

In connection with the known circuit described above, the synchronization is carried out by supplying the synchronization signal to the output of the upper threshold circuit, and thus the discharging is activated at a positive signal level of the synchronization signal. One disadvantage of this mode is that only synchronization frequencies which are lower than the rated frequency of the generator are permissible. Higher frequencies cannot be processed by the circuit. This results in the requirement that the rated frequency $f_N$ has to be rated at a value definitely higher than the synchronization frequency $f_{sync}$. The frequency difference resulting from the difference between the rated frequency and the synchronization frequency under normal operating conditions has to be a preselected so great that in the event of fluctuations due to temperature influence or aging the condition of $f_N > f_{sync}$ is always observed. This frequency difference must be overcome when free-running mode is changed to sync mode, and in the secondary circuit of the switching power supply this results in a transient decrease of the output voltage relative to the reference value, this decrease being proportional to the frequency difference. The control and regulating circuit counteracts the voltage decrease by supplying more energy from the main supply by means of a current increase. Thereby, an unduly high current can flow in the switching power supply which thus may be cut off temporarily. The switching power supply has to be dimensioned in terms of its operating characteristics so as to accommodate these unfavorable operating conditions which means that it has to be, in effect, "overdimensioned". This disadvantage could be eliminated by having a frequency difference as low as possible between the rated frequency and the synchronization frequency.

A further disadvantage of the known method for synchronization lies in the fact that reliable operation is only guaranteed with defined voltage levels of the synchronization signal. Thus, the activation of the generator only comes about at a voltage level of 2 volts. In general, also, the portion of the circuit which generate the synchronization signal is fed by the switching power supply, wherein, however, the required voltage levels of the synchronization signal are not available immediately after activation of the device. Thus, it is not possible for the generator to start oscillating. In order to avoid this undefined operational state, it is common practice to cut off the synchronization signal for a short period after switching on the generator until the necessary voltage level is reached. The cutting off of the synchronization signal results in an automatic oscillation start of the generator in the free-running mode which only later changes to the sync mode when a synchronization signal is supplied. For that purpose, a special electronic circuit complicated in design is required, which would otherwise be unnecessary if the generator could process any voltage level at its synchronization input.

SUMMARY OF THE INVENTION

It is an object of the invention to provide a method and circuit for the generation of voltage pulses, whereby the above-described drawbacks are elimited. In the sync mode, the frequency difference between the rated frequency and the synchronization frequency, occuring at the change from free-running mode to sync mode, is reduced such that only small switching currents flow and that the switching power supply can operate with high reliability and can, for a determined rated output, be dimensioned smaller than before. Furthermore, the reliability of the switching power supply is increased due to the fact that the generator oscillates even in the event of undefined signal levels occurring in the synchronization signal.

This object is achieved according to the invention by a method of the kind initially described due to the fact that the voltage increase is reset when reaching a third threshold lying between the first and the second threshold, wherein this threshold becomes effective in the absence of a synchronization signal or after reaching the second threshold, and that for resetting the voltage increase pulse edges occurring in the synchronization signal are used.

For this kind of operation, the free-running mode is activated automatically in the absence of a synchronization signal. Then the voltage increase takes place between the first and the third threshold. The latter causes the resetting of the voltage increase to the voltage value of the first threshold, and a new pulse cycle is initiated. Thereby, the rated frequency only depends on the voltage difference between the first and the third threshold since they determine the time interval of the voltage increase if the waveform of the synchronization signal remains constant.

The supply of a synchronization signal to the switching circuit has two effects. Firstly, in the event of equal voltages of the voltage pulse and the third threshold, the resetting of the voltage increase is suppressed. Secondly, the resetting is now effected by the pulse edge of the synchronization signal. The significance of the control via the pulse edges will be explained later. Thus, a resetting of the voltage increase can, depending on the respective time aspect of the synchronization signal, be triggered before or after reaching the third threshold determining the rated frequency of the generator. By using this method, synchronization frequencies which are higher or lower than the rated frequency can be processed.

The above-described method in practice results in enormous advantages. It is possible to set the rated frequency of the generator exactly at the value of the known synchronization frequency. The frequency difference between the rated frequency and the synchronization frequency, occurring at the changing from free-running mode to sync mode, under favorable conditions can thereby be reduced to a value of approximately zero. Consequently, also the switching current required for balancing the control deviation during transition is of a low value. Due to this, the switching power supply operates with high reliability and can, with a determined rated output, be dimensioned smaller with regard to its maximum current load.

The advantages of the present invention become especially clear by comparing it with the known circuit under unfavorable conditions, if e.g. the rated frequency drifts due to temperature influences or aging about a value of ± d. For reliable operation of the prior art generator it is necessary to set the frequency difference between the rated frequency and the synchronization frequency at a value higher than the expected maximum drift and thus at least at the value d. In the worst case, the frequency difference which has to be overcome at the change of the modes of operation is 2d. In contrast thereto, in the method according to the present invention the frequency difference is reduced by half to the actual drift d.

In the foregoing, the change from free-running mode to sync mode of the generator has been described. The opposite case is also of practical importance and is used when there is no synchronization signal over a certain period. Then the voltage is increased until the second, higher threshold is reached and thereupon the resetting of the voltage increase is brought about. Simultaneously, the third threshold is rendered effective again and the pulse generator oscillates in free-running mode about its rated frequency. Here, also, the frequency difference reduced according to the invention is of advantageous effect for the change between the two modes of operation.

By using pulse edges occurring in the synchronization signal for resetting the voltage increase, what is achieved is that the static voltage level at the synchronization input of the generator does not show any effect on latter's operational state. This is of especial advantage with regard to the switching on of the switching power supply as then the synchronization signal does not yet have sufficiently high voltage values or even has a static zero potential. As to the method according to the present invention, however, the generator starts oscillating at its rated frequency, and the switching power supply supplies operating voltage to the circuit generating the synchronization signal. When there are defined pulse edges of the synchronization signal, the generator is changed from free-running mode to sync mode. Also in the event no synchronization signals are generated e.g. due to an error of the circuit generating the synchronization pulses, the synchronization signal can adopt any static voltage value, whereas the pulse generator remains operative.

One embodiment of the method according to the invention is characterized by the fact that the synchronization pulse becomes effective, respectively, when the voltage increase crosses a fourth threshold lying between the first and the third threshold. As has already been described above, in the sync mode, resetting of the voltage increase is triggered by a synchronization pulse. By this embodiment it is achieved that resetting is only triggered when the voltage increase exceeds the fourth threshold. In the time interval required by the voltage increase for traversing from the first to the fourth threshold, the synchronization pulse is suppressed. This time interval which is proportional to the voltage levels of the fourth and first threshold, determines an upper frequency limit above which no sync mode is possible. Similar thereto, a lower frequency limit is determined by the voltage difference between the first and the second threshold. If the time interval between two synchronization pulses is greater than the time interval of the voltage increase from the first to the second threshold, the latter, as described above, triggers resetting of the voltage increase and simultaneously changes to free-running mode. The sync mode is thus limited to a small frequency range in which the rated frequency of the generator is included. This is advantageous inasmuch as also the maximum frequency difference at the change from free-running mode to sync mode even under most unfavourable operating conditions is restricted to a predetermined value. If temporarily no synchronization signal is generated e.g. due to an error or the synchronization frequency decreases, without this measure, when the normal synchronization frequency is reestablished, an unduly high frequency difference together with its unfavourable consequences may occur. By limitation of the sync mode to a small frequency range, this effect can be avoided.

In a further embodiment of the method it is provided that at least the first synchronization pulse of a synchronization pulse series becomes effective independent of passing the fourth threshold. Such a measure results in an effectuation of a synchronization already by the first or, as an exception, by the second synchronization pulse. If, e.g., the synchronization frequency and the rated frequency of the generator are of quite similar values, a synchronization pulse can respectively occur in that phase of voltage increase in which the synchronization signal becomes ineffective. In order to still force a lock-in of the pulse generator to the synchronization frequency, the first or the second synchronization pulses become effective and the voltage increase is reset. Thus, the voltage pulses already have at the output of the pulse generator correspond to each other with regard to frequency and phase already after the first or the second synchronization pulse.

A circuit arrangement for the performance of the method according to the invention, with a bistable circuit for triggering and resetting a voltage increase, which is switched by the output signal of a first threshold circuit to one of the two bistable switching states and by the output of a second threshold circuit to the other of the two bistable switching states which is also switchable by synchronization pulses is characterized by the fact that a third threshold circuit is provided the output signal of which is directed to a first logic circuit which combines conjunctively the output signals of the second and the third threshold circuit as well as of a third logic circuit controlled by the pulse edge of the synchronization signal, and that an edge-controlled second logic circuit disables the output of the third threshold circuit when there is a synchronization pulse series and enables it when the voltage increase passes the threshold of the second threshold circuit.

In this circuit arrangement, the bistable circuit triggers or resets the voltage increase dependent on the signal state at its input. The input which effects the triggering of the voltage increase is controlled by the output of a first threshold circuit. This first threshold circuit generates a signal when, during resetting, the voltage pulse falls below its threshold. The other input of the bistable circuit, effecting the resetting of the voltage increase, is controlled via a first logic circuit. The latter combines the output signals of a second and a third threshold circuit as well as of a third logic circuit so that a resetting of the voltage increase is effected when the voltage increase reaches a second or a third threshold or when a series of synchronization pulses occurs at the third logic circuit. A distinction has to be made between the two modes of operation, the free-running mode and the sync mode.

In free-running mode, which is characterized by the absence of synchronization pulses, the third threshold circuit is effective. The output signal of the third threshold circuit, when exceeding its threshold, causes resetting of the voltage increase via the first logic circuit and the bistable circuit. Resetting is carried out until the threshold of the first threshold circuit is surpassed and thereupon a new pulse cycle is initiated. The amplitude of the generated voltage pulse in this operational state is determined by the voltage difference between the third and the first threshold. For a constant slope of the voltage increase, pulse duration or pulse frequency are also determined by means of its amplitude.

The sync mode is characterized by the occurrence of a series of synchronization pulses. A first pulse edge controls the second logic circuit so that its output signal blocks the output of the third threshold circuit thus making it useless for resetting the voltage increase. The output signal of the third threshold circuit is only released when the second threshold circuit is triggered once. The synchronization signal is also supplied to the third logic circuit. The latter generates an output signal when a pulse edge occurs in the synchronization signal, which indirectly triggers resetting of the voltage pulse via the first logic circuit. As will be described below, the maximum voltage of the voltage pulse is limited by the second, upper threshold. Thereby, in sync mode, the voltage amplitude can adopt values between zero and the voltage difference between the first and the second threshold, according to the respective time when a synchronization pulse occurs. Thus, the amplitude can be greater but also smaller than in free-running mode.

As the voltage amplitude is directly proportional to the pulse duration and inversely proportional to the frequency of the voltage pulse, higher as well as smaller synchronization frequencies than the rated frequency can be processed in the circuit arrangement according to the invention. This results in the advantages already described above.

A change from sync mode to free-running mode takes place automatically when there is no synchronization pulse. Then the voltage increase only takes place once until the second, upper threshold is reached, and the second threshold circuit triggers resetting of the voltage pulse. Simultaneously, the output signal of the third threshold circuit is released again, and the voltage increase proceeds between the first and the third threshold.

A further significant advantage results from the fact that the second and the third logic circuits at their inputs are operated by edge control. Thus, the circuit arrangement only evaluates the pulse edges included in the synchronization signal. This means that in the absence of such pulse edges the circuit arrangement automatically adopts the free-running mode. Therein, at the inputs of the second and the third logic circuit any static voltage level can appear. Thus, undesired stopping of the generator by undefined sync signals is impossible.

A preferred embodiment of the circuit is characterized by the fact that a fourth threshold circuit is provided, the threshold of which lies between the thresholds of the first and the third threshold circuits, and the output signal of which triggers the switching through or the blocking of the synchronization signal in the third logic circuit. Thereby it is possible to suppress the synchronization signal during a certain time period which is determined by the duration of the voltage increase between the thresholds of the first and the fourth threshold circuit. Resetting of the voltage pulse can then only be carried out during this restricted period defined by the thresholds of the fourth and the second threshold circuit. In the frequency range this corresponds to a band-pass filter in which synchronization pulses can only be transmitted within an upper and a lower frequency limit. By changing the thresholds at which the fourth or the second threshold circuits are switched, the frequency difference of the upper or lower frequency limit with regard to the rated frequency can be adjusted. The limitation of the frequency of the synchronization signal has the advantage that at the change from free-running mode to sync mode, the frequency difference remains within narrow limits and consequently the maximum switching currents for controlling the voltage change at the change of the modes of operation do not exceed predetermined limits.

A further embodiment of the circuit arrangement according to the invention can be characterized in that the second logic circuit is a bistable circuit to the clock input of which the synchronization signal is supplied and to the reset input of which the output signal of the second threshold circuit is supplied. The bistable circuit is triggered by the pulse edge of the synchronization signal and remains in the thus attained state until it is reset in the original state at its reset input by the output signal of the second threshold circuit. The advantage of using a bistable circuit as the second logic circuit lies in the fact that thereby its output signals are independent of the length of the synchronization pulse and thus the circuit arrangement operates reliably.

A further embodiment of the circuit arrangement is characterized by the fact that the third logic circuit is a bistable circuit to the clock input of which the synchronization signal is supplied and which is reset by the output signal of the fourth threshold circuit. As a result of this measure, the synchronization pulses are suppressed by the third logic circuit until the voltage increase has exceeded the fourth threshold. Then the fourth threshold releases again the third logic circuit for synchronization.

By this measure the described upper frequency limit is realized.

In a further embodiment of the circuit arrangement a fourth logic circuit is provided by which the output signal of the fourth threshold circuit is rendered ineffective at least during the first pulse of a sequence of synchronization pulses. Thereby, a lock-in of the pulse generator to the synchronization frequency is urged after the first or after the second synchronization pulse at the latest.

This is of great importance if the synchronization frequency and the rated frequency substantially correspond and if the synchronization pulse occurs when the voltage increase is between the first and the fourth threshold. As has been described before, the fourth threshold circuit is responsible for the suppression of the synchronization pulse, and the desired synchronization only takes place after a phase change of the synchronization pulse. By the embodiment described herein, the output signal of the fourth threshold circuit is temporarily blocked in the event of a synchronization pulse and the generator immediately locks in on the synchronization frequency. Thereupon, the output signal of the fourth threshold circuit is released again and consequently the upper frequency limit becomes effective again.

BRIEF DESCRIPTION OF THE DRAWINGS

Embodiments of the invention will now be described with reference to the accompanying drawings in which.

DESCRIPTION OF THE PREFERRED EMBODIMENTS

Figure 1:
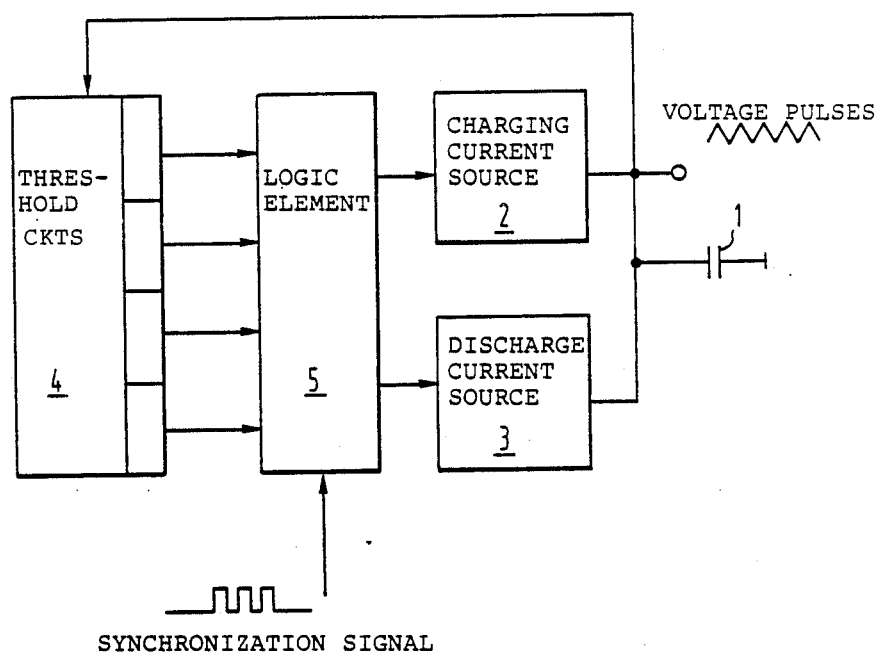
FIG. 1 is a schematic general view of a circuit arrangement for the generation of voltage pulses.

In FIG. 1 a schematic general view of the circuit arrangement for the generation of voltage pulses is shown. A capacitor 1 is alternately charged by a charging current source 2 and discharged by a discharge current source 3. For constant currents, the voltage increases or decreases are linear. At capacitor 1 the voltage pulses, in this case triangle pulses, are derived.

This output signal is supplied to threshold circuits 4 located at the input of the circuit arrangement. The threshold circuits 4 compare the respectively occurring voltage values, changing with regard to time, with a threshold derived internally from a static reference voltage. If the existing voltage exceeds such a threshold, the respective threshold circuit changes its output voltage e.g. from a positive voltage level to a negative one. The output signals of the threshold circuits are combined with a synchronization signal in a logical element 5, and from the logical element 5 two signals for controlling the charging current source 2 or the discharge current source 3 are obtained. For controlling the digital components, the following level determinations apply: A positive voltage level corresponds to the binary value 1; a ground potential or a negative voltage level correspond to the binary value 0.

Figure 2:
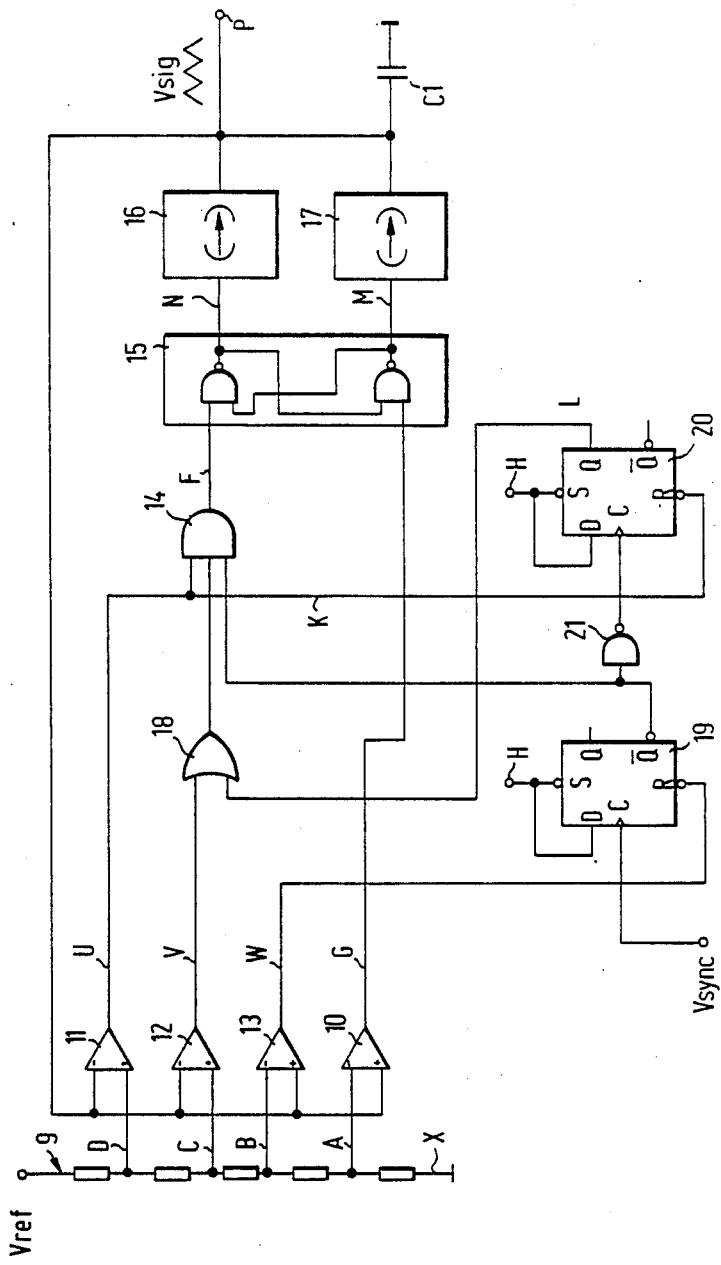
FIG. 2 is a more detailed embodiment of a circuit arrangement of FIG. 1, FIG. 3A–3L are representations of the signal states of the circuit arrangement of FIG. 2 for different operating conditions.

In FIG. 2, a more detailed embodiment of the circuit of FIG. 1 is shown. A reference voltage source with the reference voltage $V_{ref}$ feeds a voltage divider 9 which produces a threshold A, a threshold B, a threshold C, and a threshold D. Threshold A is supplied to the negative input of a threshold circuit 10 to the positive input of which the voltage values of an output signal $V_{sig}$ are supplied. Output G of the threshold circuit 10 is connected with one input of a bistable circuit 15. Threshold B is supplied to the negative input of a threshold circuit 13 which is connected with the output signal $V_{sig}$ at its positive input. At its output W, the threshold circuit 13 is connected with the reset input of a bistable circuit 19. Threshold C is supplied to the positive input of a threshold circuit 12 to the negative input of which the output signal $V_{sig}$ is transferred. At the output side, the threshold circuit 12 is connected with one input of an OR element 18. A threshold circuit 11 shows at its positive input the threshold D and at its negative input the output signal $V_{sig}$. The output signal U of the threshold circuit 11 is supplied to the reset input of a second bistable circuit 20 as well as to the input of an AND element 14. The second input of the AND element 14 is connected with output E of the OR element 18 and the third input is triggered by the negative output $\overline{Q}$ of the bistable circuit 19.

Output F of the AND element 14 is connected with one of the two inputs of the bistable circuit 15, the latter controlling a discharge current source 16 via its output N and a charging current source 17 via its other output M. The currents of the current source 16 and 17 are transferred to a capacitor C1 at the terminal P of which the output signal $V_{sig}$ appears. Synchronization pulses $V_{sync}$ are supplied to the clock input of the bistable circuit 19 the output signal $\overline{Q}$ of which triggers the bistable circuit 20 via an inverter 21. The output signal L of the bistable circuit 20 is supplied to the second input of the OR element 18. At the S and D inputs of the bistable circuits 19 and 20 a positive voltage H is connected.

In FIGS. 3A–3L, the signal states versus time t are shown, which the circuit arrangement of FIG. 2 can adopt in the various operational states. Hereby, a positive voltage corresponds to the logic signal level 1. The terms used for the signals in FIGS. 3A–3L are the same as in FIG. 2. The output signal $V_{sig}$ has an amplitude the value of which lies between the voltage value X (mass) and the threshold D. In the time period of the output signal, five different operational states are defined. After switching on the supply voltage, the starting operation a is established. Thereupon, the pulse generator changes over to free-running mode, wherein no synchronization pulses $V_{sync}$ exist. Furthermore, the sync mode c is shown which operates with synchronization pulses with frequencies higher than the rated frequency of the generator. Also the signal states for sync mode d with a frequency lower than the rated frequency are shown. Finally, the signal waveforms resulting from returning to free-running mode and starting with e in the absence of synchronization pulses are shown.

In the following, the functions of the circuit arrangement of FIG. 2 are described. The signal states corresponding to the various modes of operation can be seen in FIGS. 3A-3L. First of all, the mode as free-running pulse generator is to be described. In accordance with the conditions, there are no synchronization pulses $V_{sync}$.

A short time after switching on (operational state a in FIGS. 3A-3L), the output signal $V_{sig}$ is approximately zero, and the threshold circuit 10 generates a negative signal at its output G. Thereby, the bistable circuit 15 is triggered so that at its output M the binary signal 1 is generated and that the current source 17 is switched on. The current source 17 supplies constant current to capacitor C1 so that there is a linear increase of the output voltage at the output terminal P. When the voltage increase passes threshold C, the threshold circuit 12 switches to a negative output signal V, and at the output E of the OR element 18 a 0 signal appears on condition that the second bistable circuit 20 also has a 0 signal at its output L. Thus, output F of the AND element 14 is set to the logic level 0 and the bistable circuit 15 generates the binary signal 1 at its output N. The discharge current source 16 is switched on and thus the voltage increase at capacitor C1 is reset. The discharge current source 16 remains switched on until the output signal $V_{sig}$ reaches the threshold A, wherein a negative output signal G of the threshold circuit 10 starts a new pulse cycle.

When switching on the current supply, the logic state of the bistable circuit 20 at its output L is not defined. It can adopt the logic value 1 or 0. In the event that the output L, as indicated by a dashed line in FIG. 3A, has the logic state 1, this also results in a logic state 1 at output E of the OR element 18. The effect of the threshold circuit 12, coming about when there is a change to the negative output signal V and causing resetting of the voltage increase, thus would become ineffective. In this case the voltage increases until it reaches threshold D and in switching the threshold voltage 11 to a negative output signal U the resetting of the voltage increase is triggered. Simultaneously, the bistable circuit 20 is returned to its initial state, wherein its output signal L has the binary value 0. The pulse generator is thus led to the reliable and free-running mode shown at b in FIG. 3A. After switching on, also an undefined state of the bistable circuit 19 with its output signal $\overline{Q}$ could cause an undesired resetting of the voltage increase via AND element 14. After beginning of the voltage increase and passing the threshold B, however, the output signal $\overline{Q}$ of the bistable circuit 19, is definitely set to the logic state 1 via threshold circuit 13. Thereby, a reliable start of the pulse generator is guaranteed.

The sync mode is activated when a positive edge of a synchronization signal $V_{sync}$ appears at the clock input of the bistable circuit 19. First of all it is assumed that the voltage increase lies between the threshold values B and C (mode of operation c in FIG. 3A). Then the output signal W of the threshold circuit 13 is positive and the bistable circuit 19 is switched to the logic state 0 at its output $\overline{Q}$ by the pulse edge. Thus the logic level at the output F of the AND element 14 becomes 0 and resetting of the voltage increase is triggered via the bistable circuit 15. Simultaneously, also the bistable circuit 20 is set to the logic state 1 at its output L via the inverter 21. At output E of the OR element 18 a logic 1 appears independent of the output level of the threshold circuit 12. This state is maintained until the voltage increase once exceeds threshold D and the bistable circuit 20 is reset via the threshold circuit 11. When a synchronization pulse $V_{sync}$, as indicated by a dashed line at d in FIG. 3, arrives at the circuit arrangement during reset operation, this does not result in a change of the fundamental functions. Thus, in sync mode, the maximum amplitude of the voltage pulse is determined by the difference of the thresholds D and A.

In the following, the functions of the frequency limitation shall be explained. Synchronization pulses occurring in the time interval in which the amplitude of the voltage pulse ranges between thresholds B and D result in resetting of the voltage pulse and thus in a lock-in of the pulse generator to the synchronization frequency. In the event that the time between the synchronization pulses increases relative to the time necessary for the voltage to increase from threshold A to threshold D, the threshold circuit 11 switches back to the free-running mode before a synchronization pulse occurs. Thus, a lower frequency limit is defined. An upper frequency limit is determined by the threshold circuit 13. Synchronization pulses having differences in time being lower than the time interval necessary for the voltage increase from threshold A to B remain ineffective. The threshold circuit 13 generates at its output W a negative signal which resets the bistable circuit 19 to the initial state during this time interval so that no synchronization pulses are switched through at the output of the bistable circuit 19.

A return to free-running mode, corresponding to the mode of operation e in FIG. 3A, comes about in the absence of synchronization pulses $V_{sync}$. The voltage increase $V_{sig}$ then reaches the upper threshold D and the threshold circuit 11, by its output signal U, triggers resetting of the voltage increase. Simultaneously, the bistable logic circuit 20 is switched to its initial state by signal U, wherein signal L of the logic circuit 20 adopts the logic level 0. Consequently, output signal E of the OR element 18 only depends on the signal V and thus on the state of the threshold circuit 12. When the voltage increase reaches the threshold C, the voltage increase is reset by the signals V, E, F, N.

Figure 3:
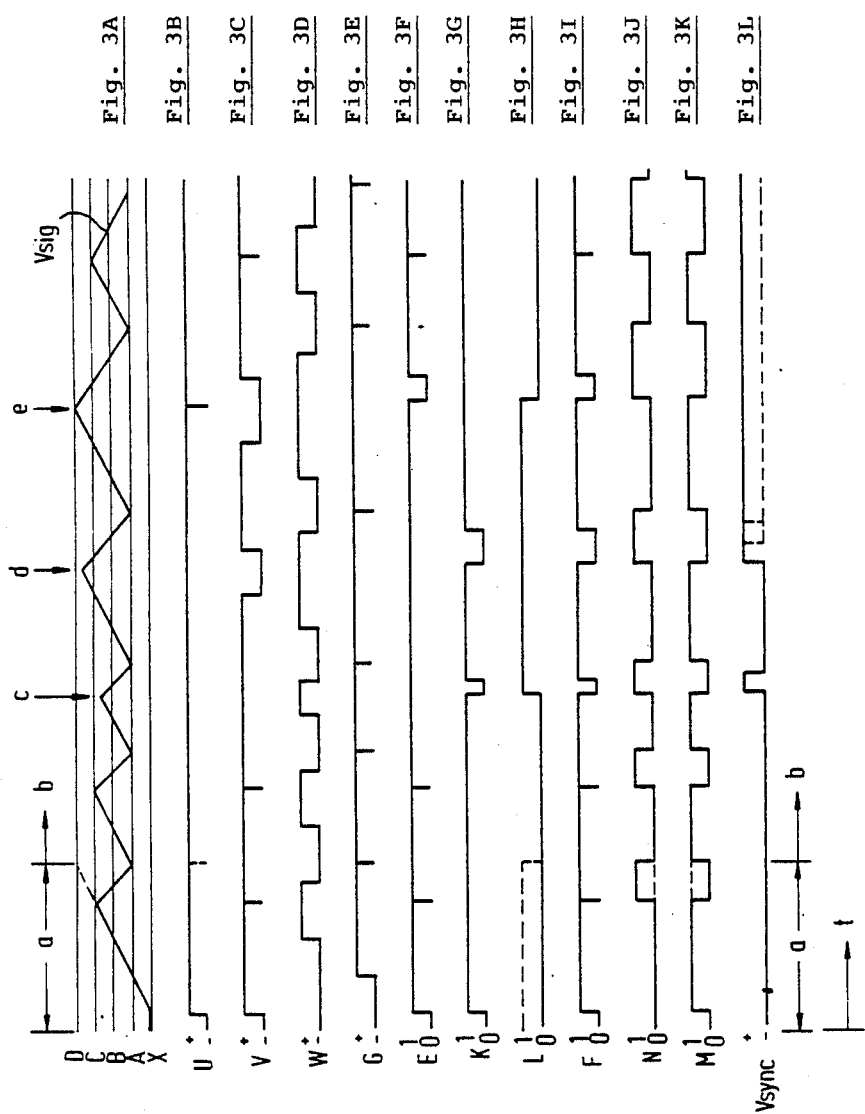

The generator oscillates in free-running mode. As shown in FIG. 3 for mode of operation e, the static voltage level of the synchronization signal $V_{sync}$, existing at the bistable circuit 19, can be positive (full line) as well as negative (dashed line).

Figure 4:
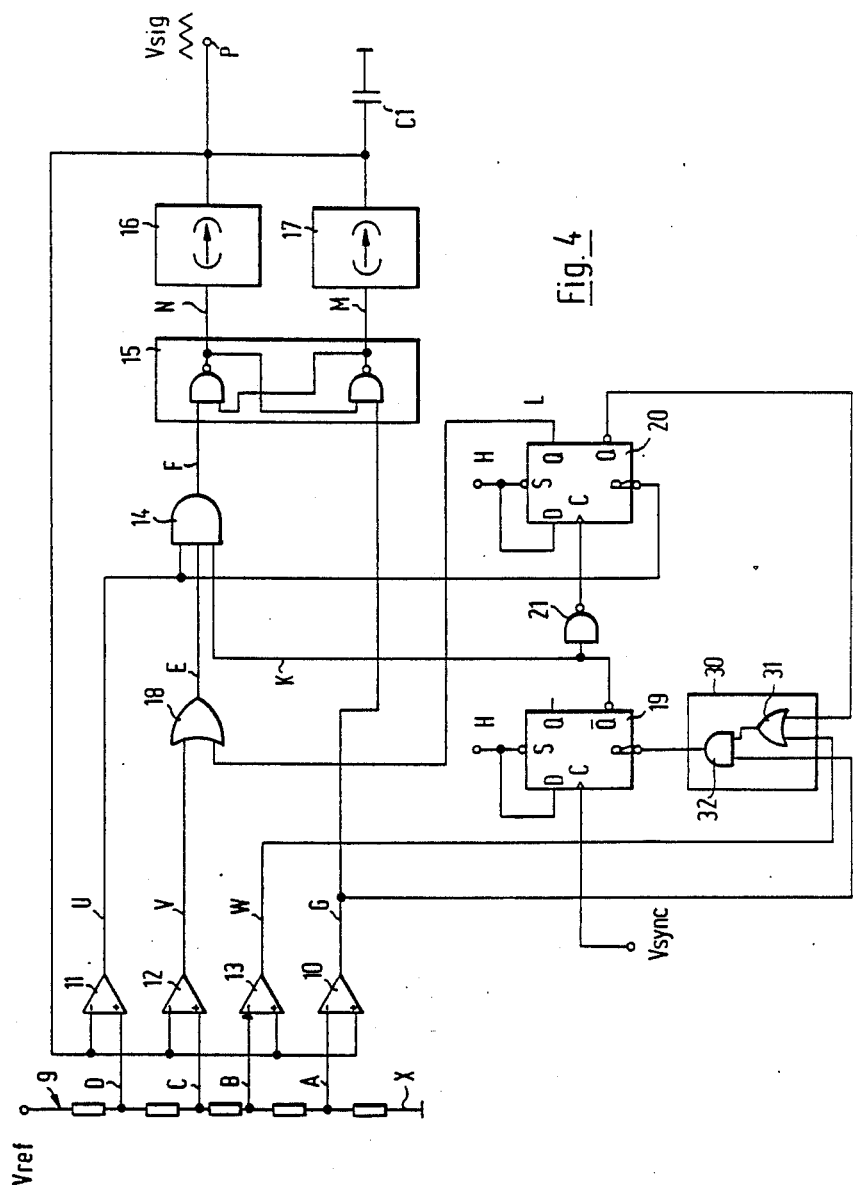
FIG. 4 is another embodiment of the circuit arrangement of FIG. 1.

In FIG. 4, a circuit arrangement for rapid synchronization is shown, which comprises all components of FIG. 2 and which is expanded only by a fourth logic circuit 30. This circuit 30 comprises an OR element 31 and an AND element 32. In this circuit, the negative input R of the second bistable logic circuit 20 is connected with one input of the OR element 31. The other input of the OR element 31 is connected with the output W of the threshold circuit 13. The AND element 32 is connected at its one input with the output of the OR element 31 and at its other input with the output G of the threshold circuit 10. The output of the fourth logic circuit 30 is connected with the reset input of the third bistable circuit 19.

The functions will now be explained on the basis of FIG. 4. In the absence of synchronization pulses, output R of the bistable circuit 20 is reset to the logic state 1. Thus, at the output of the OR element 31 a 1-signal exists, independent of the signal state of threshold circuit 13. The AND element 32, connected in series with the OR element 31, generates at its output a logic 1-signal when the voltage amplitude of the voltage pulse $V_{sig}$ lies above threshold A. Only after resetting the voltage increase, wherein the threshold circuit 10 temporarily adopts a negative potential at its output, a 0-signal is generated at the output of the fourth logic circuit 30, and the bistable circuit 19 is set to its defined initial state. When the first positive pulse edge of the synchronization signal $V_{sync}$ occurs, thereby the voltage increase is reset immediately, and the pulse generator oscillates in synchronism. The synchronization is rendered possible even below threshold B due to the switching measures described above. After the first synchronization pulse, the second bistable circuit 20 is set to a 0-signal at its output R, and the frequency-limiting effect of the threshold circuit 13 becomes again fully effective. Since the output signal R of the bistable circuit 20 can incidentally have the binary value 0 after switching on of the voltage supply of the circuit arrangement, a forced synchronization only comes about with the second synchronization pulse. Then the voltage is increased until threshold D is reached, and the threshold circuit 11 resets the bistable circuit 20 to a defined initial state.

What is claimed is:

1. A method for generating voltage pulses used to control the operation of a switching power supply of the type responsive to synchronizing signals for synchronizing the voltage pulses with a synchronization reference, comprising the steps of:
   (A) generating a voltage pulse having an amplitude which normally increases from a first voltage value to a third voltage value in the absence of one of said synchronization signals;
   (B) resetting the amplitude of the voltage pulse generated in step (A) to said first voltage value if said synchronization signal occurs during the increase of amplitude of the voltage pulse generated in step (A) from said first voltage value to said third voltage value;
   (C) then, generating a voltage pulse having an amplitude which normally increases from said first voltage value to a second voltage value higher than said third voltage value; and
   (D) resetting the amplitude of the voltage pulse generated in step (C) to said first voltage value if said synchronizing signal occurs during the increase of the amplitude of the voltage pulse generated in step (C) from the fourth voltage value to said second voltage value, wherein said fourth voltage value lies between said first and third voltage values.

2. The method of claim 1, wherein steps (C) and (D) are successively repeated to maintain synchronization of the generated voltage pulses with said synchronization reference.

3. The method of claim 1, wherein step (B) is performed by resetting the amplitude of the voltage pulse generated in step (A) to said first voltage value only when said synchronization signal occurs during the increase of the amplitude of the voltage pulse generated in step (A) from said fourth voltage value to said third voltage value.

4. The method of claim 1, wherein the resetting of steps (B) and (C) includes generally linearly reducing the amplitude of said voltage pulse over a preselected time period to said first voltage value.

5. A method for generating voltage pulses for controlling the switching operation of a switching power supply, of the type which generates a voltage pulse which starts from a first voltage threshold and normally increases until a higher second voltage threshold is reached whereupon said voltage pulse is reset, and wherein the voltage pulse is synchronized with a synchronization signal, comprising the steps of:
   (A) resetting said voltage pulse, in the absence of the occurrence of said synchronization signal, when said voltage pulse reaches a third voltage threshold, wherein said third voltage threshold lies between said first and second voltage thresholds;
   (B) resetting the amplitude of said voltage pulse, in the absence of the occurrence of said synchronization signal, when said voltage pulse reaches said second voltage threshold; and,
   (C) resetting said voltage pulse in response to the edge of said synchronization signal.

6. The method of claim 5, further including:
   (D) resetting said voltage pulse if a first synchronization pulse edge occurs when the amplitude of said voltage pulse is between said fourth and third voltage thresholds, wherein said fourth voltage threshold lies between said first and third voltage thresholds.

7. The method of claim 6, further including:
   (E) after step (D), generating a voltage pulse having an amplitude which starts from a first voltage threshold and, in the absence of said synchronizing pulse edge, normally increases in amplitude to said second voltage threshold.

8. The method of claim 7, further including:
   (F) after step (E), resetting said voltage pulse if a synchronization pulse edge occurs when the amplitude of said voltage pulse is between said fourth and second voltage thresholds.

9. The method of claim 8, wherein said resetting of the amplitude of said voltage pulses includes decreasing said amplitude in a generally linear manner over a predetermined time period.

10. The method of claim 5, further including:
    (D) resetting said voltage pulse if a first synchronization pulse edge occurs when the amplitude of said voltage pulse is between said first voltage threshold and said third voltage threshold.

11. The method of claim 10, further including:
    (E) after step (D), generating a voltage pulse having an amplitude which starts from a first voltage threshold and, in the absence of said synchronizing pulse edge, normally increases in amplitude to said second voltage threshold.

12. The method of claim 11, further including:
    (F) after step (E), resetting said voltage pulse if a synchronization pulse edge occurs when the amplitude of said voltage pulse is between said fourth and second voltage thresholds.

13. The method of claim 12, wherein said resetting of the amplitude of said voltage pulses includes decreasing said amplitude in a generally linear manner over a predetermined time period.

14. A circuit for generating a series of voltage pulses used to control the operation of a switching power supply of the type responsive to synchronizing signals for synchronizing said voltage pulses with a synchronization reference, and of the type including a bistable circuit for triggering and resetting said voltage pulses, and of the type having a first and second threshold circuit coupled with said bistable circuit for commanding the triggering and resetting said voltage pulses, comprising:

a third threshold circuit for comparing the magnitude of each one of said voltage pulses with a third reference value, said third reference value being greater than a first reference value associated with said first threshold circuit, and being less than a second reference value associated with said second threshold circuit;

a third logic circuit having an output responsive to an edge of said synchronization signal;

a first logic circuit responsive to said second and third threshold circuits, and said third logic circuit; and, a second logic circuit responsive to an edge of an output signal from said third logic circuit output and operative to disable an output of said third threshold circuit when an edge of one of said synchronizing signals occurs and operative to enable the output of said third threshold circuit when the amplitude of one of said series of voltage pulses exceeds the second reference value.

15. The circuit of claim 14, further including:
a fourth threshold circuit for comparing the amplitude of one of said series of voltage pulses with a fourth reference value which lies between said first and third reference values, said fourth threshold circuit being operatively coupled to said third logic circuit for disabling said third logic circuit when the amplitude of one of said series of voltage pulses lies below said fourth reference value and enabling said third logic circuit when the amplitude of one of said series of voltage pulses lies above said fourth reference value, wherein enabling and disabling said third logic circuit respectively cause said third logic circuit to be respectively responsive to, or not responsive to the edge of one of said synchronization signals.

16. The circuit of claim 15, wherein said second logic circuit includes a first bistable circuit having a clock input responsive to said synchronization signals and having a reset input responsive to a output of said second threshold circuit.

17. The circuit of claim 14, wherein said second logic circuit includes a first bistable circuit having a clock input responsive to said synchronization signals and having a reset input responsive to a output of said second threshold circuit.

18. The circuit of claim 17, wherein said third logic circuit includes a second bistable circuit having a clock input responsive to said synchronizing signals and having a reset responsive to a output of said fourth threshold circuit.

19. The circuit of claim 18, wherein said clock input of said second logic circuit is responsive to the output of said third logic circuit.

20. The circuit of claim 19, wherein said second logic circuit includes an inclusive OR element for enabling and disabling the output of said third threshold circuit as a function of the state of said first bistable circuit.

21. The circuit of claim 20, wherein the first logic circuit includes an AND gate.

22. The circuit of claim 21, further including a fourth logic circuit responsive to said first threshold circuit, fourth threshold circuit, and an output of said first bistable circuit, said fourth logic circuit operative to disable the output of said fourth threshold circuit during at least a first one of a sequence of said synchronization signals.

23. The circuit of claim 22, further including an AND gate and an OR gate, said OR gate being responsive to the output of said fourth threshold circuit and the output of said first bistable circuit, said AND gate being responsive to the output of said or gate and the output of said first threshold circuit.

24. A circuit for generating a voltage pulses used to control the operation of a switching power supply of the type which is responsive to synchronizing signals used to synchronizing said voltage pulses to the synchronizing signals, comprising:

means for generating said voltage pulses;

means responsive to the amplitude of said voltage pulse for sensing when the amplitude of one of said voltage pulses has exceeded each of a plurality of preselected voltage levels;

means coupled with said sensing means for detecting the occurrence of an edge of one of said synchronizing signals; and, means associated with said sensing and detecting means for enabling said generating means to be controlled by said sensing and detecting means.

25. The apparatus of claim 24, wherein said generating means includes a first bistable circuit and a current source and a current sink, said first bistable circuit being coupled with said current source and current sink such that in one stable state of said first bistable circuit, said current source is operative to produce a constant current and said current sink is operative to create a high impedance current path, and in the other stable state thereof, said first bistable circuit causes said current source to produce a high impedance current path and said current sink is operative to produce a constant current load.

26. The apparatus of claim 25, wherein said sensing means includes a plurality of electrical comparators each having an output and each respective comparator operable for comparing the magnitude of one of said voltage pulses with one of said associated reference values.

27. The apparatus of claim 26, wherein said detecting means includes a second and third bistable circuit, said second bistable circuit being enabled to respond to an edge of one of said synchronizing signals only if the amplitude of one of said voltage pulses has exceeded the output of a preselected one of said electrical comparators, and said third bistable circuit having an output which is operative to disable the output of a preselected one of said electrical comparators if said second bistable circuit responds to said synchronizing signal.

28. The apparatus of claim 27, wherein said detecting means further includes logic means responsive to at least two outputs of said plurality of electrical comparators and the inverse of the output of said third bistable circuit, said logic means enabling said second bistable circuit to respond to said synchronizing signal when the amplitude of said voltage pulse lies between two of the preselected reference values.

29. The apparatus of claim 27, wherein said enabling means includes, an OR gate having two inputs and one output, and
an AND gate having three inputs and one output,
said OR gate inputs being respectively associated with,
the output of one of said plurality of electrical comparators, and
the inverse of the output of said third bistable circuit,
said AND gate inputs being respectively associated with,
the output of one of said plurality of electrical comparators,
an output of said second bistable circuit, and
the output of said OR gate,
the output of said AND gate commanding one of the two stable states of said first bistable circuit.

* * * * *